United States Patent [19]

Matossian et al.

[11] Patent Number: 5,498,290

[45] Date of Patent: Mar. 12, 1996

[54] CONFINEMENT OF SECONDARY ELECTRONS IN PLASMA ION PROCESSING

[75] Inventors: Jesse N. Matossian, Canoga Park; John D. Williams, Agoura Hills, both of Calif.

[73] Assignee: Hughes Aircraft Company, Los Angeles, Calif.

[21] Appl. No.: 113,552

[22] Filed: Aug. 27, 1993

[51] Int. Cl.⁶ .................................................. C23C 16/00
[52] U.S. Cl. ................ 118/723 E; 118/723 ER; 118/723 HC; 118/719
[58] Field of Search .................. 118/723 E, 723 ER, 118/723 HC, 719; 250/251, 492.2

[56] References Cited

U.S. PATENT DOCUMENTS

| | | | |
|---|---|---|---|
| 4,764,394 | 8/1988 | Conrad . | |
| 4,925,542 | 5/1990 | Kidd | 118/723 X |
| 5,218,179 | 6/1993 | Matossian et al. | 219/121.430 |
| 5,330,800 | 7/1994 | Schumacher et al. | 427/523 |
| 5,354,381 | 10/1994 | Sheng | 118/723 E |
| 5,374,456 | 12/1994 | Matossian | 427/570 |

FOREIGN PATENT DOCUMENTS 0603864 6/1994 European Pat. Off. .

Primary Examiner—Robert Kunemund
Assistant Examiner—Joni Y. Chang
Attorney, Agent, or Firm—V. D. Duraiswamy; W. K. Denson-Low

[57] ABSTRACT

A plasma ion implantation apparatus includes a vacuum chamber that receives the object within its walls. The object is supported upon an electrically conductive base that is electrically isolated from the wall of the vacuum chamber. An electrically conductive enclosure is positioned between the object and the wall of the vacuum chamber and supported upon the base. The enclosure is made of an electrically conductive material. A plasma source is positioned so as to create a plasma in the vicinity of the object to be implanted. A voltage source applies an electrical voltage to the base and thence the enclosure relative to the wall of the vacuum chamber. Secondary electrons emitted from the object during implantation are reflected back into the plasma by the enclosure, reducing X-ray production and improving plasma efficiency.

16 Claims, 4 Drawing Sheets

CONFINEMENT OF SECONDARY ELECTRONS IN PLASMA ION PROCESSING

BACKGROUND OF THE INVENTION

This invention relates to the surface treatment of materials by plasma ion processing, such as plasma ion implantation, and, more particularly, to improving the efficiency and safety of such treatments.

Ion implantation is a process wherein ions are accelerated by an electrostatic potential to impact a surface of an object. The energy of the ions causes them to be imbedded beneath the surface. A sufficient concentration of the implanted ions can significantly increase the hardness of the surface.

Ion implantation traditionally accomplished by creating a beam of ions and accelerating the ions toward the surface by a sufficiently large electrostatic potential. This approach, while operable, is difficult to use on many large or irregularly shaped objects, because the beam of ions must be swept over the entire surface. Where the surface has sharp curves, bores, points, or other such features, a uniform implantation is difficult to achieve.

An alternative approach is plasma ion implantation ("PII"), which is described in U.S. Pat. No. 4,764,394. The object to be implanted is placed into a vacuum chamber. A plasma of ions is created adjacent to the surface of the object to be implanted. The object is electrostatically charged to a potential opposite to that of the ions. For example, if positively charged nitrogen ions are to be implanted, the object is negatively charged using repetitive, short-duration voltage pulses of typically about 50,000–300,000 volts (50–300 kilovolts). The nitrogen ions are attracted to the surface of the object by this accelerating potential and driven into the surface and sub-surface regions of the object. Plasma ion implantation has the advantage that the plasma of ions provides a source that is distributed around the entire surface area of the object, and uniform implantation over the entire surface area is simultaneously achieved.

One result of the impacting of the ions against the surface is the production of secondary electrons with a high energy corresponding to that of the implanted ions. The electrons are repelled from the surface and impact into the walls of the vacuum chamber in which the PII process is conducted. The secondary electrons cannot penetrate through the vacuum chamber walls. Instead, they produce X-rays that do pass through the steel vacuum chamber walls and out of the vacuum chamber walls.

These X-rays emitted from the vacuum chamber would otherwise injure persons and damage equipment in the neighborhood of the vacuum chamber, but lead or concrete shielding is usually provided to absorb the X-rays. In a PII system, the intensity of the X-ray production is dependent upon the implantation voltage and the total current of the secondary electrons incident upon the vacuum chamber walls. In a typical 100 kilovolt PII implantation of stainless steel objects in a 4 foot diameter by 8 foot long vacuum chamber, the electron current per pulse can be as high as 500 amperes. To absorb the intensity of X-rays produced at this voltage and current, lead shielding placed directly on the vacuum chamber exterior walls with a thickness of about 0.25 inches has been found to be sufficient to allow for safe, legal operation with personnel in and around the periphery of the vacuum chamber.

For implantation voltages above 100 kilovolts, the X-ray absorption of lead decreases with increasing energy of the secondary electrons. The required thickness of the shielding therefore increases with increasing voltage used in the plasma ion implantation process. For many advanced processes, the use of implantation voltages of as much as 300 kilovolts is highly advantageous, which in turn requires lead shielding about 10–20 times as thick as required for implantation voltages of 100 kilovolts. The plasma ion implantation chamber must therefore be covered with a thick lead shield, or placed into a lead room, or placed at a remote site. This requirement can be costly, hazardous, and impractical.

In addition to producing X-rays, the production of secondary electrons also contributes to an inefficiency of the PII process. For each implanted ion, there may be 1–10 secondary electrons produced, depending upon the material being implanted, the implantation voltage, and the type of ion being implanted. Each secondary electron carries energy away as an inefficiency of the process. The secondary electrons pass through the surrounding plasma without losing any substantial amount of energy to it. Most of the energy or power is absorbed by the secondary electrons, making the plasma ion implantation process inherently inefficient.

There is a need for an improvement to the plasma ion processing apparatus and process. The production of secondary electrons is a natural result of the material from which the implanted object is formed, and it is therefore not sufficient to rely upon a change in the nature of the object to avoid the problem. The present invention fulfills this need, and further provides related advantages.

SUMMARY OF THE INVENTION

The present invention provides an improved plasma processing apparatus and process, preferably a plasma ion implantation ("PII") apparatus and process, that greatly reduces or eliminates the emission of X-rays from the vacuum chamber walls. To accomplish this result, the secondary electrons produced in the PII process are redirected into the plasma that surrounds the object, and the energy of the secondary electrons is absorbed by the plasma. This effect reduces the need for power input to the plasma from other sources and improves the efficiency of the process. Because the secondary electrons are redirected Into the plasma, X-rays are not produced to any significant degree. The present invention thus reduces the safety risks otherwise associated with high-energy plasma ion implantation and other types of plasma processing, as well as the need for heavy shielding of the apparatus or other precautions to protect against X-ray exposure. For the purposes of the present invention, other types of plasma processing are the equivalents of plasma implantation if they produce X-rays requiring shielding.

In accordance with the invention, a plasma ion implantation apparatus for plasma ion implanting an object comprises a vacuum chamber adapted for receiving the object within a wall of the vacuum chamber, a plasma source positioned so as to create a plasma in the vicinity of the object, and means for electrically biasing the object to cause implantation of Ions from the plasma. There is also means for preventing secondary electrons emitted by the object from reaching the wall of the vacuum chamber. The means preferably includes a properly electrically biased metallic enclosure that surrounds the object, except for an aperture in the enclosure through which the plasma is admitted.

More specifically, a plasma ion implantation apparatus comprises a vacuum chamber adapted for receiving the object within a wall of the vacuum chamber and a plasma source positioned so as to create a plasma in the vicinity of the object. The plasma source has a plasma source cathode, and a plasma source anode operating at a selected plasma source anode potential. An enclosure made of an electrically conducting material is positioned between the object and the wall of the vacuum chamber. There is provided a first electrical biasing means for electrically biasing the object to an object potential relative to the plasma source anode potential, and a second electrical biasing means for electrically biasing the enclosure to an enclosure potential that is a positive multiple of the object potential. The positive multiple is preferably 1.0, but may be more or less and may be varied over the time duration of the applied voltage pulse. The object potential and the enclosure potential are readily biased to the same electrical potential by placing the enclosure in electrical communication with the object or a support base of the object.

A preferred plasma ion implantation apparatus comprises a vacuum chamber adapted for receiving the object within a wall of the vacuum chamber, and an electrically conductive base upon which the object is supported, the base being electrically isolated from the wall of the vacuum chamber. An electrically conductive enclosure is positioned between the object and the wall of the vacuum chamber and supported upon the base. A plasma source is positioned so as to create a plasma in the vicinity of the object, and a voltage source applies an electrical voltage to the base and the enclosure relative to the wall of the vacuum chamber.

The plasma is present in the space between the enclosure and the object being implanted. Secondary electrons are emitted into this space from the object as it is impacted by the implanted ions. If the enclosure is biased to a positive multiple of the base potential equal to or greater than 1.0, it will repeatedly reflect the secondary electrons back into the plasma. The energy of the secondary electrons is gradually absorbed into the plasma, so that less energy input into the plasma from other sources is required. The secondary electrons cannot reach either the enclosure or the wall of the vacuum chamber, with the result that there is reduced emission of X-rays. When the enclosure is biased to a positive multiple of the base potential of slightly less than 1.0, the secondary electrons are absorbed at the enclosure wall after passing through the intervening plasma one time. Although the secondary electrons strike the enclosure wall, they do so at low energy and, consequently, do not generate X-rays.

The apparatus described herein provides an important advance in the art of plasma ion implantation. Safety risk is reduced, with a corresponding reduction in the need for shielding, by preventing production of X-rays by secondary electrons. Process power efficiency is improved by using the energy of the secondary electrons to heat the plasma. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
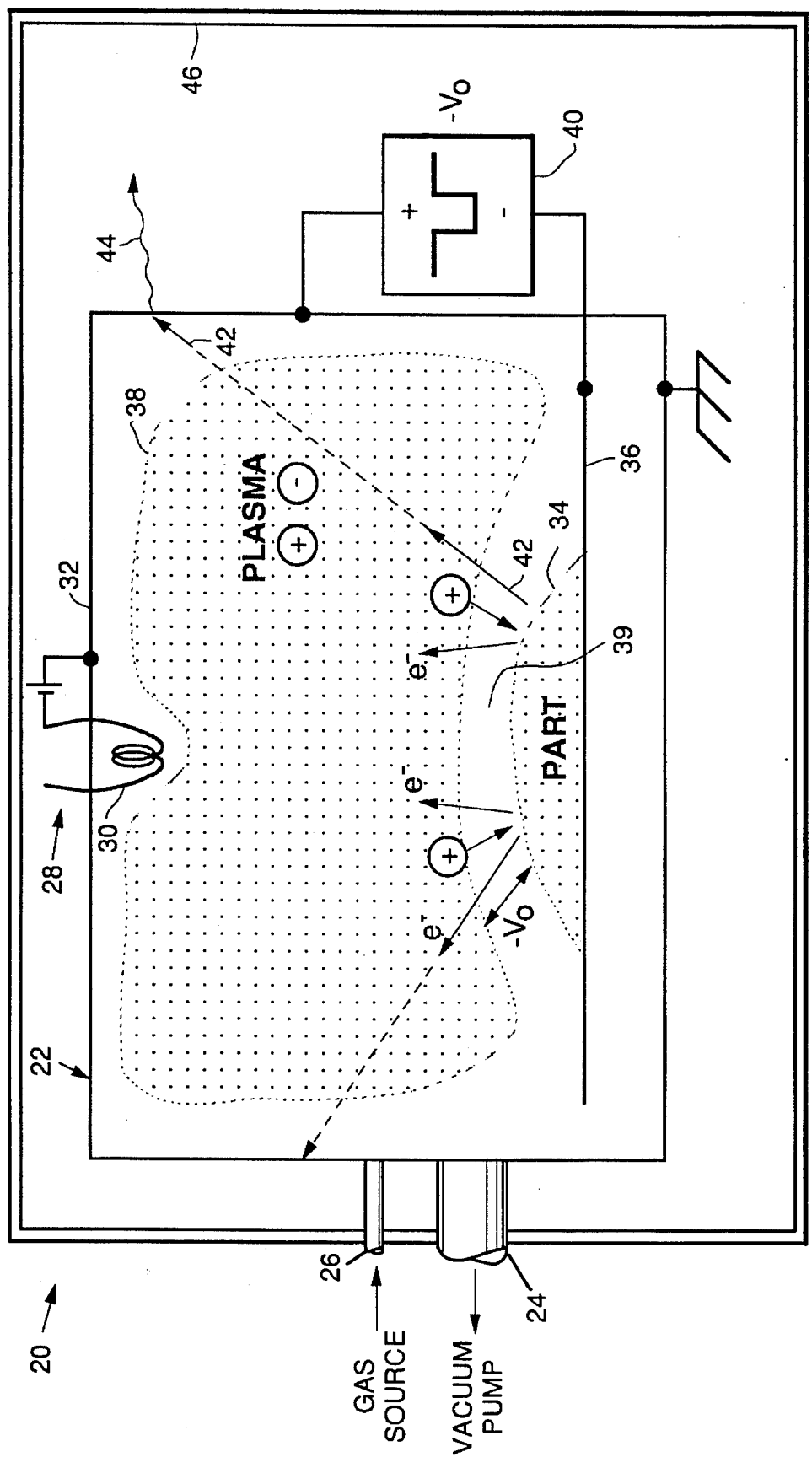
FIG. 1 is a schematic view of a plasma ion implantation apparatus that does not use the present approach.

The present invention is used in conjunction with the plasma ion implantation of an object. ("Plasma ion implantation", as used herein, includes plasma processes for implanting ions and also other plasma processes that otherwise produce X-rays for which shielding is required.) FIG. 1 is an illustration of a plasma ion implantation apparatus 20, which does not utilize the present approach, to show the nature of the problems solved by the present invention. The apparatus 20 includes a vacuum chamber 22 that is pumped through a vacuum line 24 by a pump (not shown). A gas that provides the ions to be implanted is introduced through a backfill line 26 from a gas source (not shown). In the present example, a gas such as nitrogen that produces positively charged ions is presumed.

A plasma source 28 includes a cathode, in this case a filament 30 within the interior of the vacuum chamber 22. An electrical current is passed through the filament 30 to heat the filament. The anode of the plasma source is a wall 32 of the vacuum chamber 22, which is grounded. An object 34 to be plasma processed is supported on an electrically conducting base 36 within the interior of the vacuum chamber 22. The object 34 and base 36 are electrically isolated from the wall of the vacuum chamber 22.

The plasma source 28 creates a plasma 38 that fills at least a portion of the interior of the vacuum chamber 22. The backfilled gas is ionized in part to produce positive ions within the plasma 38. The base 36 and thence the object 34 are electrically negatively biased with pulses from a power source 40. Positive ions in the plasma 38 are accelerated from the plasma and across a plasma sheath 39, and into the object 34 by this biasing voltage, which is typically in the range of from about −50 to −300 kilovolts (−50,000 to −300,000 volts) relative to the grounded wall 32 and thence relative to the anode of the plasma source 28 and the plasma 38. In this conventional process, the plasma sheath 39 develops only around the object 34.

The ions accelerated with the biasing voltage are driven into the object 34 and implanted into its surface by an amount that depends upon the nature of the surface of the object, the type of ions being implanted, and the implantation voltage. As the implanted ions interact with the material of the object 34, electrons are produced and emitted from the object 34. These electrons, termed "secondary electrons", are indicated at numeral 42. Each implanted ion may typically produce 1–10 secondary electrons, depending upon the type of ion implanted, the implantation voltage used, and the material being implanted.

At least some of the secondary electrons 42 leave the object 34 and travel through the interior of the vacuum chamber 22 and strike its wall 32. Very little energy of the secondary electrons 42 is absorbed by the plasma 98. When the secondary electrons 42 strike the wall 92, their energy is absorbed and X-rays 44 are produced.

The X-rays 44 are emitted in all directions, and at least some of the X-rays 44 leave the vacuum chamber 22 and travel outwardly. The X-rays 44 are harmful to humans, and can damage sensitive electronic equipment that is located nearby. It is therefore necessary to encase the vacuum chamber 22 in extensive shielding 46, which may be lead, concrete, earth, etc. The shielding 46 may be separate from the vacuum chamber 22, or it may be placed directly on the exterior of the vacuum chamber walls. If lead shielding is used, the thickness of the lead shielding is dependent upon the implantation voltage used and the secondary electron current density that results. In a typical example, for 100 kilovolt accelerating potential pulses applied by the power source 40, a peak secondary electron current per pulse of 500 amperes is obtained for nitrogen ions implanted into a 3 foot by 5 foot stainless steel object. To shield against the X-rays that are produced, a thickness of lead of about 0.25 inches is required when the lead shielding is applied directly to the exterior of the vacuum chamber. Higher accelerating potentials require even thicker shielding. For large-scale vacuum chambers such as those measuring more than four feet in diameter and eight feet in length, it is inconvenient to provide such a lead shield around all components of the chamber 22.

The production of secondary electrons 42 and conversion of their energy to X-rays 44 also consumes a great deal of power. All of the power lost to this mechanism is wasted to the process, since it does not aid in the ion implantation or the production of plasma. This loss mechanism contributes to an overall inefficiency of the plasma ion implantation process.

Figure 2:
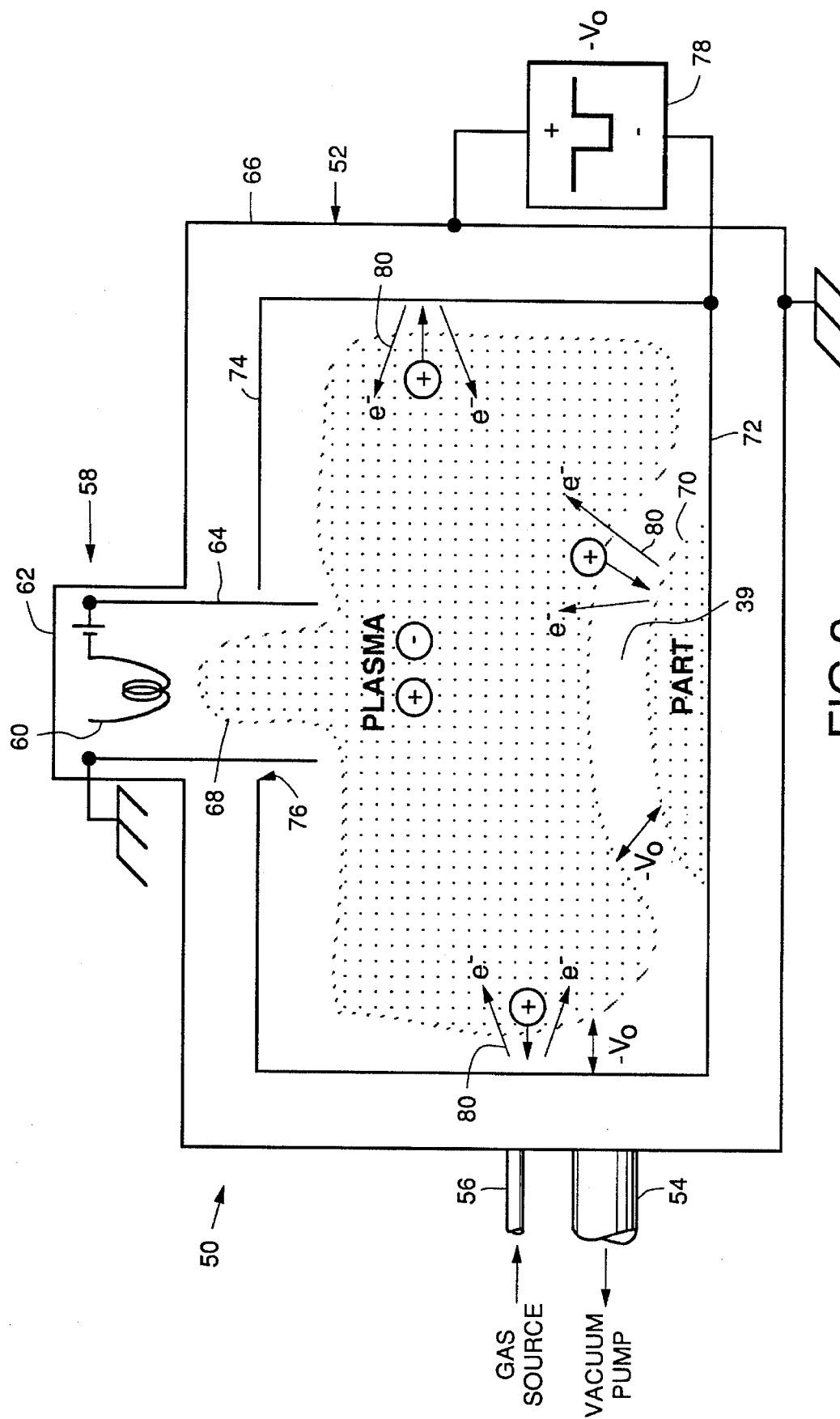
FIG. 2 is a schematic view of a plasma ion implantation apparatus made according to the present invention.

FIG. 2 depicts one embodiment of a plasma ion implantation apparatus 50 according to the present invention. The apparatus 50 includes a vacuum chamber 52 that is pumped through a vacuum line 54 by a pump (not shown). A gas that provides the ions to be implanted is introduced through a backfill line 56 from a gas source (not shown). In the present example, a gas such as nitrogen that produces positively charged ions is presumed.

A remote plasma source 58 is utilized. The remote plasma source 58 includes a cathode filament 60 that is located in an extension 62 of the vacuum chamber 52. An electrical current is passed through the filament 60 to heat the filament. A cylindrical, electrically conductive anode 64 is supported within the extension 62, and extends outwardly into the interior of the vacuum chamber. The anode 64 is electrically isolated from a wall 66 of the vacuum chamber 52, but is preferably maintained at ground electrical potential, as is the wall 66. The remote plasma source 58 produces a plasma 68 within the cylindrical volume of the anode 64.

An object 70 to be implanted is supported on an electrically conducting base 72 within the interior of the vacuum chamber 52. An electrically conductive enclosure 74 is positioned around the object 70, between the object 70 and the wall 66 of the vacuum chamber 52. In the illustrated embodiment of FIG. 2, the enclosure 74 sits upon base 72. The object 70 is therefore fully enclosed by the base 72 below and the enclosure 74 on the sides and top. The presence of the enclosure does increase the surface area over which ion implantation occurs, which in turn increases the time required to complete ion implantation of the object 70. The surface area of the enclosure can be used most effectively by placing or mounting objects to be implanted on the enclosure walls.

The anode 64 of the remote plasma source 58 extends through an aperture 76 in the enclosure 74, providing a path for the plasma 68 to fill the interior of the enclosure. The plasma 68 produced within the interior volume of the anode 64 expands outside of the anode 64 into at least a portion of the interior volume of the enclosure 74. The plasma 68 surrounds the object 70.

The backfilled gas is ionized in part to produce positive ions within the plasma 68. The base 72, the object 70, and the enclosure 74 are electrically negatively biased with pulses from a power source 78. Positive ions in the plasma 68 are accelerated from the plasma 68 to the object 70 by this biasing voltage, which is typically in the range of from about −50 to −300 kilovolts relative to the grounded anode 64 of the plasma source 58, and therefore relative to the plasma 68.

The ions accelerated with this biasing voltage are driven into the object 70 as well as the wall of the enclosure 74, and implanted into these surfaces by an amount that depends upon the nature of the surfaces, the type of ion being implanted, and the implantation voltage. As the implanted ions interact with the material of the object 70 and the walls of the enclosure 74, secondary electrons 80 are produced and emitted from the object 70 and the walls of the enclosure 74. Each implanted ion may produce 1–10 secondary electrons.

Figure 3:
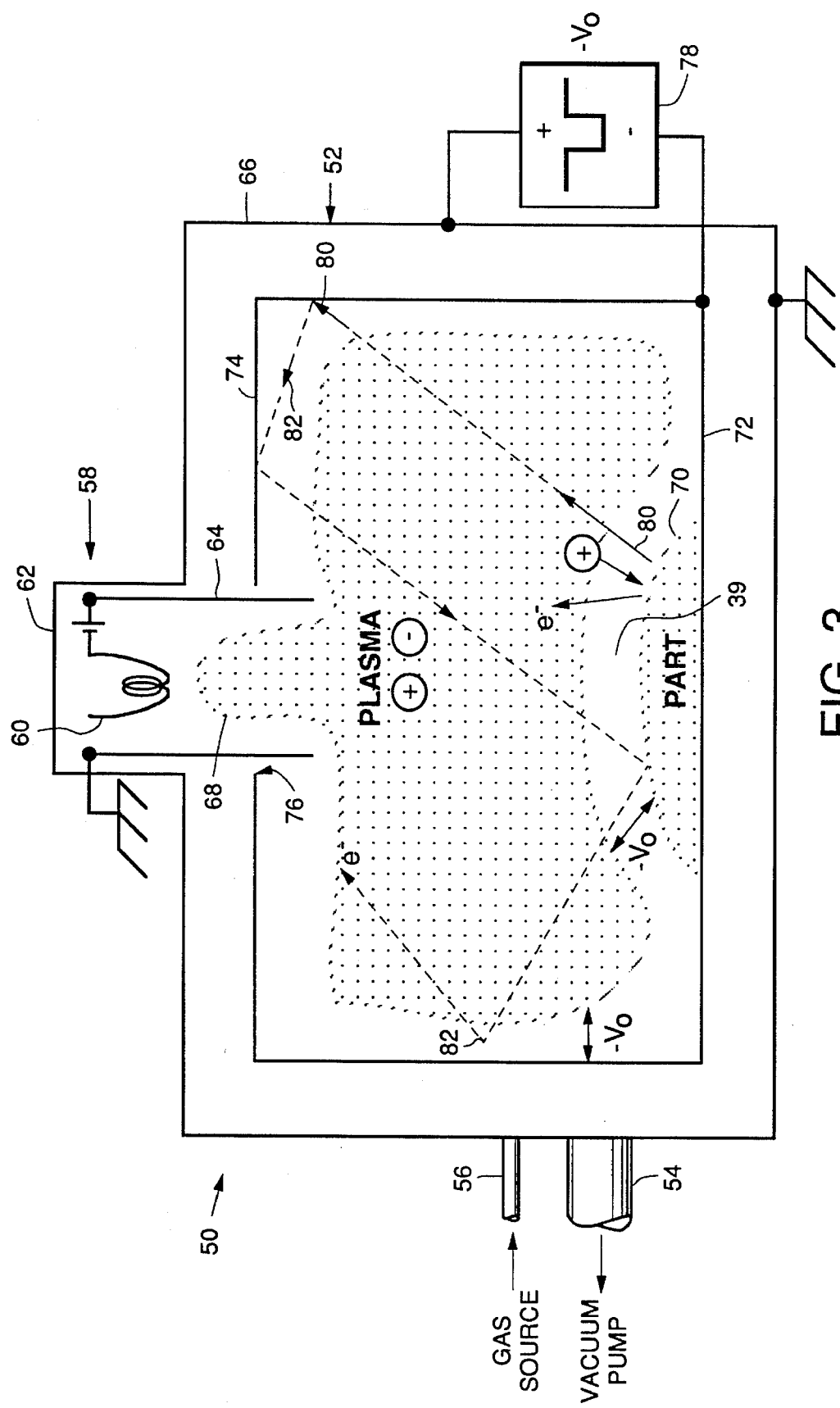
FIG. 3 is a reproduction of the view of FIG. 2, showing the mode of secondary electron decay.

The enclosure 74 is electrically biased with the same biasing voltage and waveform as the base 72 and the object 70. FIG. 3 illustrates the beneficial effects of biasing the enclosure 74 in this manner. The secondary electrons 80 that are emitted from the object 70 and the walls of the enclosure 74 travel through the plasma 58, but are repelled by the electrical potential of the enclosure 74. The secondary electrons 80 therefore do not enter the material of the enclosure 74 and cannot produce X-rays, nor do they reach the wall 66 of the vacuum chamber 22 to produce X-rays. X-ray production is therefore greatly reduced or eliminated entirely. Exterior shielding can also therefore be greatly reduced or eliminated entirely.

Instead of entering the material of the enclosure 74 or the walls 66, the secondary electrons 80 are repelled, as indicated at numeral 82. The rebounded secondary electrons may encounter the enclosure 74 numerous times, each time being repelled by the electrostatic potential of the enclosure 74, the object 70, or the base 72. The numerous rebounds of the secondary electrons significantly increases their probability of interacting with the plasma 68, compared to the one-pass traversal in a conventional PII process as illustrated in FIG. 1. The multiple rebounds of the electrons therefore allows the energy of the secondary electrons to transfer from the secondary electrons into the plasma 68. After a sufficient number of rebounds, the energy of the secondary electrons has decayed to a low level. The enclosure 74 thus effectively lengthens the path length of travel of the secondary electrons through the plasma so that energy may transfer from the secondary electrons into the plasma. This energy transfer energizes the plasma, so that less energy is required from other sources to maintain the plasma 68.

The result is an improved efficiency of the apparatus 50. The present approach does not attempt to suppress the production of secondary electrons. Such an attempt might require changes in the operating parameters of the apparatus 50 that could adversely affect the implantation treatment. Instead, the present approach accepts the production of secondary electrons as part of the preferred implantation process, and suppresses the adverse effects (power loss and X-ray production) of such secondary electron production.

Ions striking the enclosure 74 also produce secondary electrons. These secondary electrons are repeatedly reflected from other regions of the enclosure 74, the base 72, and the object 70 being implanted. The secondary electrons have a small probability of striking the anode 64 of the plasma source 58, which in turn results in the production of X-rays. The extent of X-ray production and the energy of any resulting X-rays can be reduced by forming the anode from a low-Z material such as carbon, producing a sufficiently strong magnetic field around the region of the anode, or placing lead shielding around the anode.

The use of the low-Z material, the effective averaged energy of the X-ray spectrum is reduced. The magnetic field turns and reflects the energetic secondary electrons produced In the process as they approach the region near the plasma source 58, while not significantly inhibiting low energy plasma production. The lead shielding placed around the plasma source (external to the vacuum chamber) absorbs most of the X-rays produced there.

Figure 4:
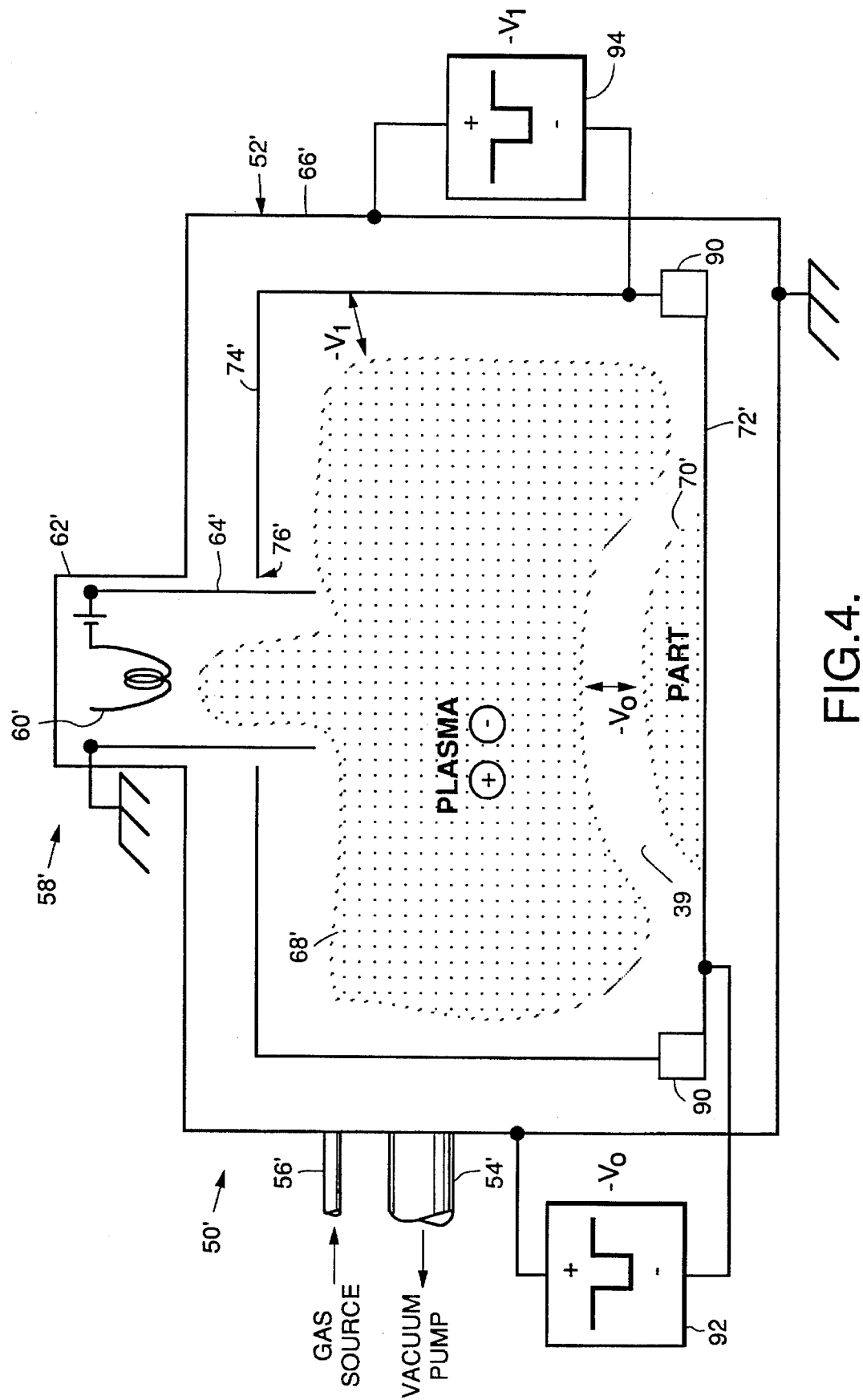
FIG. 4 is a schematic view of an alternative embodiment of the plasma ion implantation apparatus of the invention.

FIG. 4 depicts an alternative embodiment of an apparatus 50' for utilizing the present invention. Most of the structural features of the apparatus 50' are the same as those of the apparatus 50 of FIG. 2, and those features have been assigned the same numerals as in FIG. 2, except that primes (') have been added to the numerals. The corresponding prior description is incorporated here.

The apparatus 50' differs from the apparatus 50 in that the enclosure 74' is electrically isolated from the base 72' by insulators 90. The base 72' and object 70' are electrically biased to a negative potential relative to the anode 64' and walls 66' by a first biasing means, in this case a first power source 92. The enclosure 74' is electrically biased to a different negative potential relative to the anode 64' and the walls 66' by a second biasing means, in this case a second power source 94. This apparatus 50' permits the enclosure 74' to be biased with a different voltage, voltage timing, and/or voltage waveform than the object 70' being implanted.

The following examples are selected to illustrate aspects of the invention, but should not be interpreted as limiting of the invention in any respect.

EXAMPLE 1

The present invention has been practiced using an apparatus 50 like that depicted in FIG. 2. In this apparatus 50, the vacuum chamber 52 was generally cylindrical with an interior diameter of 4 feet and a length of 8 feet. The backfilled gas was nitrogen. The power source 78 delivered 200 Hertz pulse trains, each pulse being about 10 microseconds in duration. The enclosure, the base, and the vacuum chamber walls were made of the same stainless steel material. The enclosure 74 was dimensioned to have a clearance of at least about 3 inches from the interior of the wall of the vacuum chamber. The enclosure 74 could be placed into the vacuum chamber 52 and used in the manner previously discussed, or it could be removed to determine the effect of its presence. The vacuum chamber was shielded with a thickness of 0.25 inches of lead. A viewing port through the vacuum chamber wall was available.

In a first set of tests, the implantation voltage was 50 kilovolts and the total current provided by the power source 78 was 20 milliamps. When no enclosure 74 was present, an X-ray dosimeter positioned outside the unshielded viewing port read 20 millirems per hour in steady state. When the enclosure 74 was used in the manner indicated and with the same system operating conditions, the dosimeter reading was reduced to less than 1 millirem per hour.

In a second set of tests, the implantation voltage was 75 kilovolts and the total current provided by the power source 78 was 15 milliamps. When no enclosure 74 was present, the dosimeter read 85 millirems per hour in steady state. When the enclosure was used and with the same operating conditions, the dosimeter reading was reduced to 20 millirems per hour in steady state.

In each case, the presence of the enclosure significantly reduced or eliminated the production of X-rays.

EXAMPLE 2

During the work discussed in Example 1, stainless steel test coupons were used as the objects 70, placed onto the base 72. Nitrogen ions were implanted at 50 kilovolts accelerating potential for 1 hour, with the enclosure in place. The X-ray dosimetry studies reported as part of Example 1 were conducted during this period. At the conclusion of the implantation, the coupons were removed and analyzed by Secondary Ion Mass Spectroscopy (SIMS) for the total nitrogen implantation dose in ions per square centimeter. The actual dose was determined to be $1.0 \times 10^{17}$ per square centimeter. The expected dose was also predicted to be $1.0 \times 10^{17}$ per square centimeter, based upon experience with the system in the absence of the enclosure. The predicted dose was in agreement with the actual dose, indicating that the presence of the enclosure did not adversely affect the ion implantation.

EXAMPLE 3

As part of the work described in Example 1, the interior walls of the enclosure were studied after implantation was complete in each case. They were found to be uniformly discolored due to uniform implantation of nitrogen ions into the enclosure. Because the enclosure is biased in the same manner as the object 70, it is expected that implantation would occur into the enclosure walls as well as into the object being implanted. The enclosure itself is not harmed, and can be reused many times.

Although a particular embodiment of the invention has been described in detail for purposes of illustration, various modifications may be made without departing from the spirit and scope of the invention. Accordingly, the invention is not to be limited except as by the appended claims.

What is claimed is:

1. Plasma ion implantation apparatus for plasma ion implanting an object, comprising:
   a vacuum chamber adapted for receiving the object within a wall of the vacuum chamber;
   a plasma source positioned so as to create a plasma in the vicinity of the object, the plasma source having
      a plasma source cathode, and
      a plasma source anode operating at a selected plasma source anode potential;
   an enclosure positioned between the object and the wall of the vacuum chamber, the enclosure being made of an electrically conductive material;
   first electrical biasing means for electrically biasing the object to an object potential relative to the plasma source anode potential; and
   second electrical biasing means for electrically biasing the enclosure to an enclosure potential that is a positive multiple of the object potential.

2. The apparatus of claim 1, further including an electrical ground fixed to the wall of the vacuum chamber.

3. The apparatus of claim 1, wherein the selected plasma source anode potential is the same as that of the wall of the vacuum chamber.

4. The apparatus of claim 1, wherein the first biasing means produces an object potential that is the same as the enclosure potential produced by the second biasing means.

5. The apparatus of claim 1, wherein the positive multiple of the second biasing means is 1.0.

6. The apparatus of claim 1, wherein the enclosure is in electrical communication with the object, and wherein the first electrical biasing means and the second electrical biasing means are embodied in a single power source.

7. Plasma ion implantation apparatus for plasma ion implanting an object, comprising:

a vacuum chamber adapted for receiving the object within a wall of the vacuum chamber;

a plasma source positioned so as to create a plasma in the vicinity of the object;

means for electrically biasing the object to cause implantation of ions from the plasma; and means for preventing secondary electrons emitted by the object from reaching the wall of the vacuum chamber, wherein the means for preventing includes an enclosure placed between the object and the wall of the vacuum chamber.

8. Plasma ion implantation apparatus for plasma ion implanting an object, comprising:

a vacuum chamber adapted for receiving the object within a wall of the vacuum chamber;

a plasma source positioned so as to create a plasma in the vicinity of the object;

means for electrically biasing the object to cause implantation of ions from the plasma; and means for preventing secondary electrons emitted by the object from reaching the wall of the vacuum chamber, wherein the means for preventing includes an enclosure placed between the object and the wall of the vacuum chamber and electrically biased to an electrical potential different from that of the wall of the vacuum chamber.

9. The apparatus of claim 8, wherein the enclosure is biased to the same electrical potential as the object.

10. The apparatus of claim 7, wherein the enclosure is biased such that the secondary electrons emitted by the object are repeatedly repelled back into the plasma to energize the plasma.

11. Plasma ion implantation apparatus for plasma ion implanting an object, comprising:

a vacuum chamber adapted for receiving the object within a wall of the vacuum chamber;

an electrically conductive base upon which the object is supported, the base being electrically isolated from the wall of the vacuum chamber;

an enclosure positioned between the object and the wall of the vacuum chamber and supported upon the base, the enclosure being made of an electrically conductive material;

a plasma source positioned so as to create a plasma in the vicinity of the object; and a voltage source that applies a negative electrical voltage to the base and the enclosure relative to the wall of the vacuum chamber.

12. The apparatus of claim 11, further including an electrical ground fixed to the wall of the vacuum chamber.

13. The apparatus of claim 11, wherein the plasma source includes a plasma source cathode, and a plasma source anode operating at a selected plasma source anode potential.

14. The apparatus of claim 13, wherein the selected plasma source anode potential is the same as that of the wall of the vacuum chamber.

15. The apparatus of claim 11, wherein the voltage source applies a plurality of negative pulses of from about −50 to about −300 kilovolts.

16. The apparatus of claim 7 wherein the enclosure has an aperture through which the plasma is admitted.

* * * * *